United States Patent
Shih et al.

(12) 
(10) Patent No.: US 6,195,380 B1
(45) Date of Patent: Feb. 27, 2001

(54) LASER DIODE FOR DIGITAL VERSATILE DISKS AND METHOD OF FABRICATING THE SAME

(75) Inventors: Kwang-Kuo Shih; Man-Fung Huang, both of Hsinchu Hsien; Ming-Huang Hong, Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/041,909

(22) Filed: Mar. 13, 1998

(51) Int. Cl.[7] .................................................. H01S 5/183
(52) U.S. Cl. ........................................ 372/96; 372/46
(58) Field of Search ................................ 372/46, 96

(56) References Cited

U.S. PATENT DOCUMENTS

| | | | |
|---|---|---|---|
| 4,949,349 | 8/1990 | Ohba et al. ................... | 372/45 |
| 5,065,402 | 11/1991 | Kawano ........................ | 372/46 |
| 5,903,588 | * 5/1999 | Guenter et al. ............... | 372/46 |
| 6,014,400 | * 1/2000 | Kobayashi .................... | 372/96 |

* cited by examiner

Primary Examiner—James W. Davie

(57) ABSTRACT

A laser diode for digital versatile disks or other purposes and its fabricating method are disclosed. The fabrication does not require any regrowth steps during the MOCVD process or the formation of nitride or oxide to serve as dielectrics, thus significantly simplifying the fabrication process. Further, the laser diode can operate with a relatively low threshold current due to its excellent current confinement. The laser diode for digital versatile disk is made of AlGaInP alloy, in which a layer of $Al_xGa_{1-x}As$, where x>0.8, is formed between the AlGaInP cladding layers. The layer of $Al_xGa_{1-x}As$ is then oxidized in a hot vapor atmosphere to form $AlO_x$ that has at least one opening formed thereon. The $AlO_x$ layer serves as a current confinement layer and can provide excellent current confinement. The $AlO_x$ layer can also serve as a dielectric layer in the ridge structure.

10 Claims, 3 Drawing Sheets

LASER DIODE FOR DIGITAL VERSATILE DISKS AND METHOD OF FABRICATING THE SAME

BACKGROUND TO THE INVENTION

1. Field of the Invention

The present invention relates to semiconductor lasers and methods of fabricating such lasers. In particular, the present invention relates to digital versatile disks (hereafter referred to as "DVD") laser diode structure and fabrication methods.

2. Description of Prior Art

Semiconductor lasers are widely used in communication and data storage. For communication, an IR laser with a long wavelength is normally used. On the other hand, a laser with a relative short wavelength, such as an AlGaInP-based laser diode, is used for data storage.

AlGaAs-based laser diodes, which have a wavelength of 780 nm, are commonly used to record data on compact discs and CD-ROM discs. With the development of DVD, AlGaInP-based laser diodes are now in great demand since the wavelength of the laser light source used in the DVD specification is set to 630~650 nm.

The formula of AlGaInP alloy can be represented by $(Al_xGa_{1-x})_{0.5}In_{0.5}P$ where x is a value between 0 and 1. The lattice of AlGaInP alloy is matched with that of GaAs. The AlGaInP alloy is a direct semiconductor when x is between 0 and 0.7. That is, the energy gap of $Ga_{0.5}In_{0.5}P$ is 1.9 eV for x=0; the energy gap of $(Al_{0.7}Ga_{0.3})_{0.5}In_{0.5}P$ is 2.3 eV for x=0.7. Therefore, the light-emitting AlGaInP-based devices emit red light. The $(Al_{0.7}Ga_{0.3})_{0.5}In_{0.5}P$ alloy, having a larger energy gap, can serve as a barrier layer in a quantum well, a waveguide or a cladding layer in the light-emitting device.

In the past, many structures and fabricating methods of AlGaInP-based laser diode have been proposed. Reference may be made to FIG. 1, which illustrates a cross section of a selectively buried ridge waveguide laser diode. Such a laser diode includes an n-type AlGaInP cladding layer 12, a GaInP active layer 14, a p-type AlGaInP cladding layer 16, an n-type GaAs blocking layer 18, a p-type GaInP layer 19, a p-type GaAs contact layer 20 and a p-type electrode 22 formed in this order on an n-type GaAs substrate 10. Then, an n-type electrode 21 is formed on the other side of the n-type GaAs substrate 10.

The structure mentioned above is fabricated by the MOCVD (Metalorganic Chemical Vapor Deposition) method, which grows an n-type AlGaInP cladding layer 12, a GaInP active layer 14, a p-type AlGaInP cladding layer 16, an n-type blocking layer 18 and a p-type GaInP layer 19 in order on an n-type GaAs substrate 10. A layer of $Si_3N_4$ or $SiO_2$ is then formed on the p-type GaInP layer 19. By photolithography and etching processes, a pattern of a strip having a width of 3~5 μm is defined on the $Si_3N_4$ or $SiO_2$ layer. The strip of $Si_3N_4$ or $SiO_2$ layer is used to serve as a mask in the etching process. The deposited layers are then etched back to the p-type AlGaInP cladding layer 16 with the mask. By selectively applying MOCVD processes, a layer of n-type GaAs 18 is formed on the sidewall and the area except the strip area, i.e., the mask, to serve as a current blocking layer. A p-type GaAs contact layer 20 is then formed thereon after removing the strip mask.

Based on the above description, the fabrication process is very complex, because there are two regrowth steps in the fabrication process for a selectively buried ridge waveguide laser diode.

FIG. 2 shows another conventional semiconductor laser, a hetero-barrier blocking laser diode, which includes an n-type AlGaInP cladding layer 26, a GaInP active layer with quantum wells 28, a p-type AlGaInP cladding layer 30, a p-type GaInP cap layer 32, a p-type GaAs contact layer 34 and a p-type electrode 36 formed in this order on an n-type GaAs substrate 24, and an n-type electrode 35 formed on the other side of the n-type GaAs substrate 24.

The hetero-barrier blocking laser diode confines the current by the hetero-barrier blocking effect. That is, the current is confined by the difference between voltage drops of the p-type AlGaInP cladding layer 30/the p-type GaAs contact layer 34 and the p-type AlGaInP cladding layer 30/the p-type GaInP cap layer 32/the p-type GaAs contact layer 34.

Compared to the fabrication of a selectively buried ridge waveguide laser diode, a regrowth step can be reduced in the fabrication process of a hetero-barrier blocking laser diode. However, such structure has an inferior current confinement, and thus a low threshold current for the laser diode may not be obtained.

Referring to FIG. 3, the other conventional laser diode, a ridge waveguide laser diode, is provided. Such laser diode includes an n-type AlGaInP cladding layer 42, an active layer 44, a p-type AlGaInP cladding layer 46, a dielectric layer 48, a p-type GaInP layer 50, a p-type GaAs layer 52 and a p-type electrode 54 formed in this order on an n-type GaAs substrate 40, and an n-type electrode 53 formed on the other side of the n-type GaAs substrate 40. A ridge waveguide is formed on the p-type AlGaInP cladding layer 46, and both of the p-type GaInP layer 50 and the p-type GaAs layer 52 are formed on the ridge waveguide.

The above dielectric layer 48 can be nitride or oxide. Both of the n-type AlGaInP cladding layer 42 and the p-type AlGaInP cladding layer 46 can be represented by $(Al_xGa_{1-x})_{0.5}In_{0.5}P$, where x is 0.7. The active layer 44 has a quantum well structure, which consists of $Ga_yIn_{1-y}P$ and $(Al_xGa_{1-x})_{0.5}In_{0.5}P$ formed in turn.

The ridge waveguide laser diode can be fabricated without the using of regrowth steps during the MOCVD process, but the etching of very small ridge width is difficult. Besides, the power output for single mode operation is limited.

As described above, the methods to fabricate AlGaInP laser diode of the prior art are too complicated and can be simplified by this invention.

SUMMARY OF THE INVENTION

Accordingly, one object of the present invention is to provide a laser diode structure for DVD and the fabrication method, which can significantly simplify the fabrication process.

A further object of the present invention is to provide a laser diode structure for DVD and the fabrication method, which allows for a relatively low threshold current for the laser diode.

One feature of the fabrication method of this invention is the forming of a layer of $Al_xGa_{1-x}As$ (x>0.8) between the top and/or the bottom AlGaInP cladding layer, then oxidizing the AlGaAs layer to form $AlO_x$ by an oxidization step, and forming apertures on the $AlO_x$ layer. The $AlO_x$ layer can serve as a current confinement layer. Hence, since there is no need for regrowth steps, the fabrication process can be significantly simplified. Furthermore, since the opening or the aperture on the $AlO_x$ layer can be easily controlled, small size openings can be easily obtained.

BRIEF DESCRIPTION OF THE DRAWINGS

The following detailed description, given by way of example and not intended to limit the invention solely to the embodiments described herein, will best be understood in conjunction with the accompanying drawings in which.

DETAILED DESCRIPTION OF THE PREFERRED EMBODIMENTS

Figure 4:
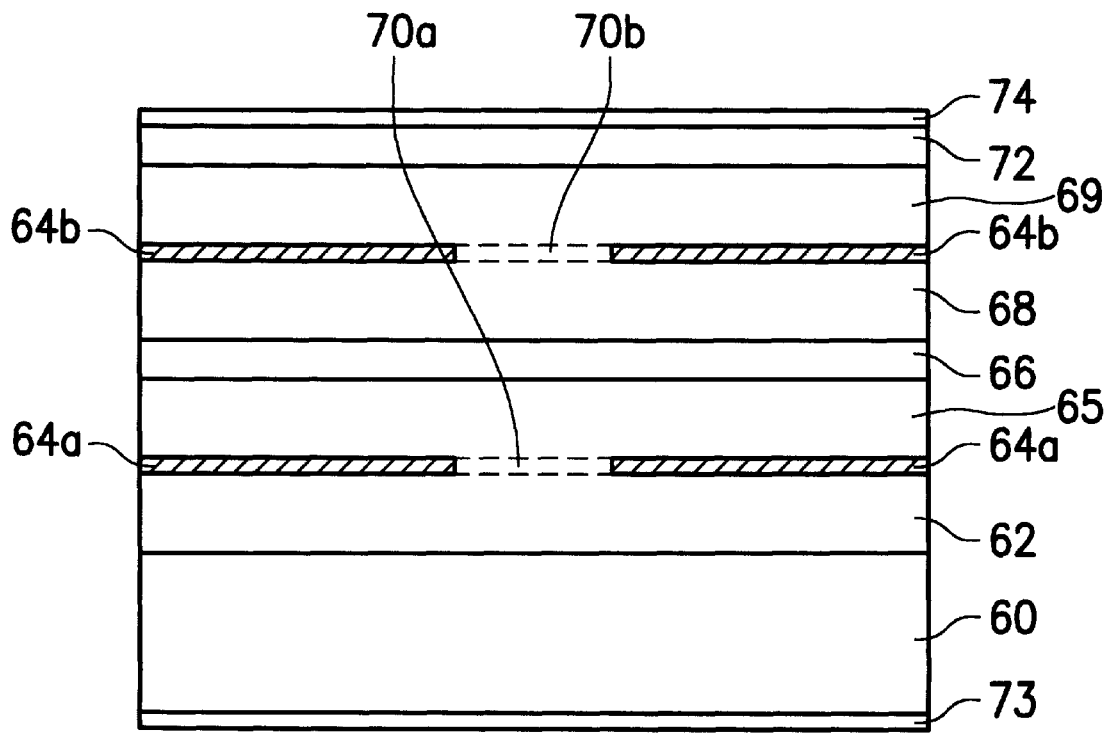
FIG. 4 is a cross section illustrating a laser diode structure for DVD based on an embodiment of this invention.

The first embodiment of this invention has a structure as shown in FIG. 4, which includes: An n-type GaAs substrate 60; an n-type AlGaInP cladding layer 62 formed on the n-type GaAs substrate 60; an n-type AlAs or $Al_xGa_{1-x}As$ (x>0.8) layer 64a formed on the n-type AlGaInP cladding layer 62, wherein opening 70a having a size of 2~10 μm is formed after the oxidation of $Al_xGa_{1-x}As$ layer 64a to confine and block current flowed therethrough; a GaInP active layer with quantum wells 66 formed on top of the n-type AlGaInP cladding layer 65; a p-type AlGaInP cladding layer 68 formed on top of the GaInP active layer 66; a p-type AlAs or $Al_xGa_{1-x}As$ (x>0.8) layer 64b formed on top of p-type AlGaInP cladding layer 68, wherein opening 70b having a size of 2~10 μm is formed after the oxidation of $Al_xGa_{1-x}As$ layer 64b to confine and block current flowed therethrough; a p-type GaAs contact layer 72 formed on the p-type AlGaInP cladding layer 69; a p-type electrode 74 formed on the p-type GaAs contact layer 72; and an n-type electrode 73 formed on the other side of the n-type GaAs substrate 60.

In this embodiment, instead of regrowing n-type GaAs to confine and block current by MOCVD, $AlO_x$ is formed by oxidization, thus simplifying the fabrication process.

The fabrication process of this invention involves the following steps: (i) Providing an n-type GaAs substrate; (ii) sequentially forming n-type AlGaInP cladding layers, a GaInP active layer with quantum wells, p-type AlGaInP cladding layers and a p-type GaAs contact layer on the n-type GaAs substrate, wherein n-type AlGaAs layer is formed between the n-type AlGaInP cladding layers, and similarly for the p-type AlGaAs layer; (iii) forming electrodes on the n-type GaAs substrate and the p-type GaAs contact layer, respectively; and (iv) oxidizing the n-type AlGaAs layer and the p-type AlGaAs layer to form $AlO_x$ layers, wherein the openings or apertures are formed on the $AlO_x$ layers, to confine and block the current flowing therethrough.

Both the n-type AlGaAs layer and the p-type AlGaAs layer are in a form of $Al_xGa_{1-x}As$, where x is larger than 0.8. The n-type AlGaAs layer and the p-type AlGaAs layer both have a thickness of about 200~3000 Å.

Oxidizing of the AlGaAs layers is achieved by putting the substrate with the deposited layers into an oxidization furnace that maintains a temperature of 400~500° C. At this point, nitrogen bubbles are introduced into the oxidization furnace after passing through water at a temperature of 90~95° C. Thus the AlGaAs is oxidized and forms $AlO_x$ due to the hot vapor atmosphere. The size of the openings depends on the oxidization time.

Figure 1:
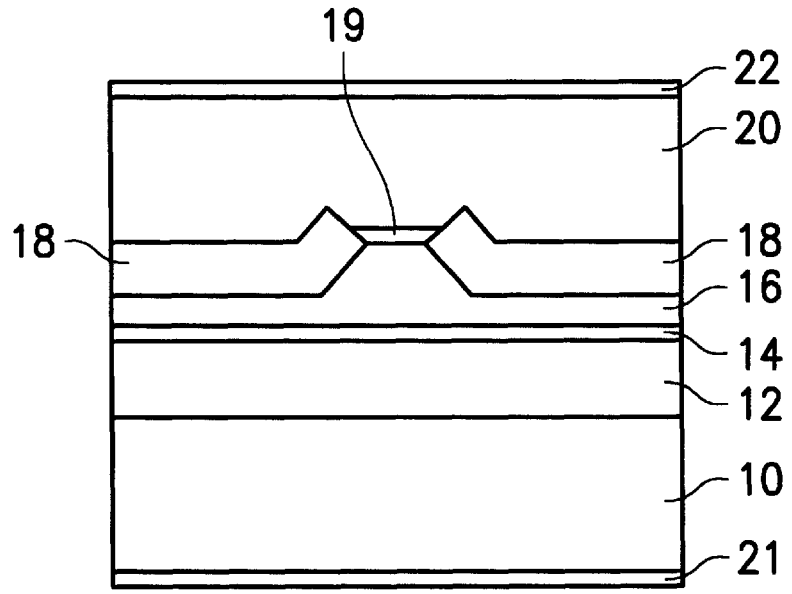
FIG. 1 is a cross section illustrating a conventional laser diode structure.
Figure 2:
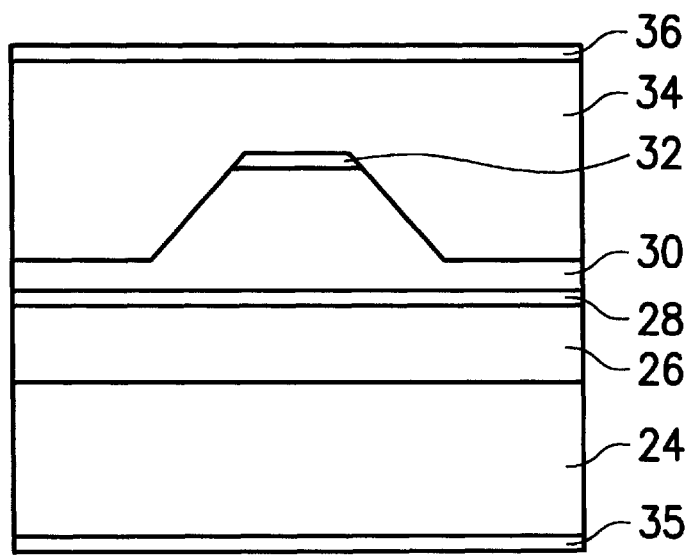
FIG. 2 is a cross section illustrating another conventional laser diode structure.
Figure 3:
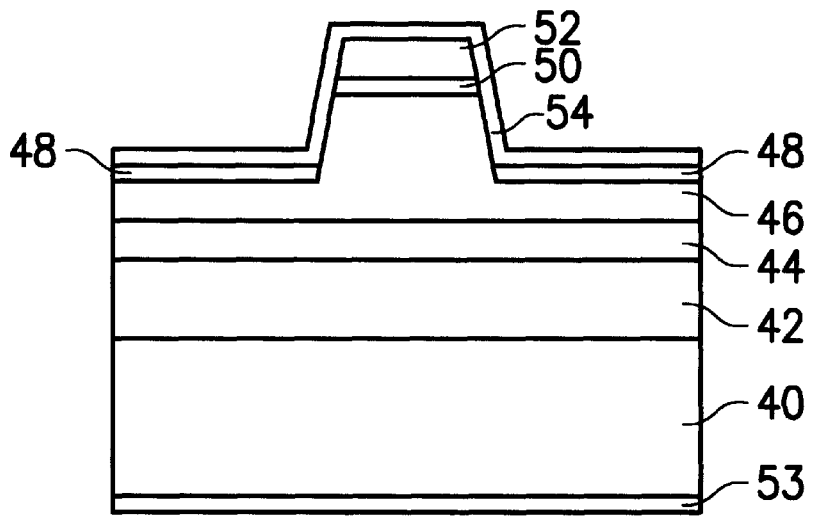
FIG. 3 is a cross section illustrating the other conventional laser diode structure.
Figure 5:
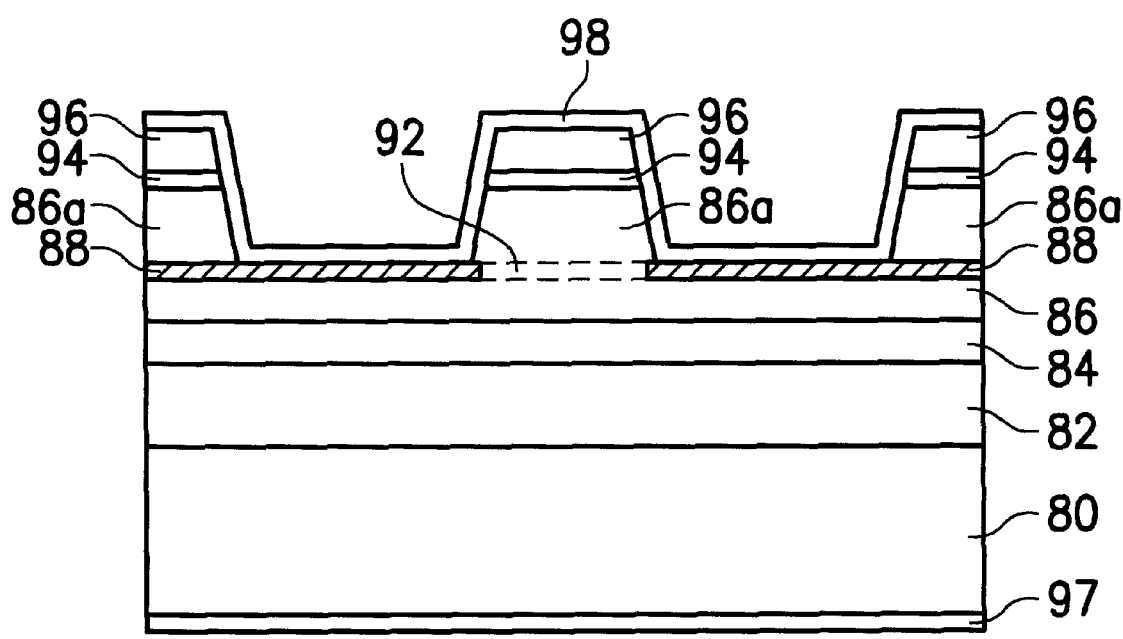
FIG. 5 is a cross section illustrating a laser diode structure for DVD based on another embodiment of this invention.

Referring to FIG. 5, the second embodiment of the laser diode for DVD has a structure similar to the ridge waveguide laser diode shown in FIG. 3, which includes: An n-type GaAs substrate 80; an n-type AlGaInP cladding layer 82 formed on the n-type GaAs substrate 80; an active layer 84 formed on the n-type AlGaInP cladding layer 82; a p-type AlGaInP cladding layer 86 formed on the active layer with quantum wells 84; an AlAs or $Al_xGa_{1-x}As$ (x>0.8) layer 88, formed on the type AlGaInP cladding layer 86, provided with an opening to confine and block the current flowing therethrough, having a ridge structure formed thereon consisting of a p-type AlGaInP cladding layer 86a, a p-type GaInP layer 94 and ap-type GaAs layer 96; a p-type electrode 98 formed on the p-type GaAs layer 96 and the $Al_xGa_{1-x}As$ layer 88; and an n-type electrode formed on the other side of the n-type GaAs substrate 80.

The process of fabricating a DVD laser diode based on this embodiment involves the following steps: (i) Providing an n-type GaAs wafer to serve as a substrate; (ii) sequentially forming an n-type AlGaInP cladding layer, a GaInP active layer with quantum wells, a p-type AlGaInP cladding layer and a p-type GaAs contact layer on the n-type GaAs substrate, wherein a p-type AlGaAs layer is formed on top of p-type AlGaInP cladding layer; (iii) oxidizing the p-type AlGaAs layer to form $AlO_x$, wherein an opening is formed to confine and block the current flowing therethrough; (iv) etching the p-type GaAs layer, the p-type GaInP layer and the p-type AlGaInP cladding layer to the level of the $AlO_x$ layer by photolithography and etching processes, so as to form mesas with ridge structure consisting of the p-type GaAs layer, the p-type GaInP layer and the p-type AlGaInP cladding layer on the $AlO_x$ layer; (v) forming an n-type electrode on the other side of the n-type GaAs substrate and forming a p-type electrode on the $AlO_x$ layer and the p-type GaAs layer; and (vi) chipping the wafer to form laser diode dies.

Both the n-type AlGaInP cladding layer and the p-type AlGaInP cladding layer are of the form $(Al_xGa_{1-x})_{0.5}In_{0.5}P$, where x is 0.7. Further, the active layer has the structure of many quantum wells, which is formed by alternately growing $Ga_xIn_{1-x}P$ and $(Al_yGa_{1-y})_{0.5}In_{0.5}P$, where x is between 0.4 and 0.6 and y is between 0.4 and 0.7. The AlGaAs layer has a thickness of 200~3000 Å and is of the form $Al_xGa_{1-x}As$, where x is larger 0.8.

The method of oxidizing the AlGaAs layers in step (iii) is putting the substrate with the deposited layers into an oxidization furnace that maintains a temperature of 400~500° C. At this time, nitrogen bubbles are introduced into the oxidization furnace after passing through a water of 90~95° C. Thus the AlGaAs is oxidized and forms $AlO_x$ due to the hot vapor atmosphere. The oxidizing time depends on the size of the openings on the $AlO_x$ layers.

In FIG. 5, the $AlO_x$ layer is not only used as the current confining layer but also used as an etching stop layer for the forming of the ridge structure. Besides, it serves as a dielectric layer as the layer 48 shown in FIG. 3. The size of the opening in the $AlO_x$ depends on the oxidation time so that an opening having a small size such as 2~3 μm can be easily obtained.

In order to confine and block current in a DVD laser diode, this invention first grows AlGaAs or AlAs between the cladding layers formed on a substrate, then oxidizes the AlGaAs or AlAs to form $AlO_x$ by placing the substrate in a hot vapor atmosphere. Furthermore, openings are formed so that current can flow through the openings. Compared to the prior art, this invention has a simpler fabrication process since it does not require any regrowth step of MOCVD. Further, the laser diode of this invention has a low threshold current due to the excellent current confinement provided by the openings in the $AlO_x$ layer.

While the present invention has been specifically illustrated and demonstrated with reference to certain preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A laser diode for digital versatile disks or other applications comprising:
    a first-type GaAs substrate;
    a first layer of first-type AlGaInP cladding layer formed on one side of the first-type GaAs substrate;
    a first $AlO_x$ layer formed on the first layer of first-type AlGaInP cladding layer, in which a first opening is formed on the first $AlO_x$ layer to confine and block current flowed therethrough;
    a second layer of first-type AlGaInP cladding layer formed on the first $AlO_x$ layer and the first opening;
    a GaInP active layer with quantum wells formed on the second layer of first-type AlGaInP cladding layer;
    a first layer of second-type AlGaInP cladding layer formed on the GaInP active layer;
    a second $AlO_x$ layer formed on the first layer of second-type AlGaInP cladding layer, in which a second opening is formed on the second $AlO_x$ layer to confine and block current flowed therethrough;
    a second layer of second-type AlGaInP cladding layer formed on the second $AlO_x$ layer and the second opening;
    a second-type GaAs contact layer formed on the second layer of second-type AlGaInP cladding layer;
    a second electrode formed on the second-type GaAs contact layer; and
    a first electrode formed on the other side of the first-type GaAs substrate.

2. A laser diode as claimed in claim 1 wherein the opening formed on the first $AlO_x$ layer and the second $AlO_x$ layer has a dimension of about 2~10 μm.

3. A laser diode as claimed in claim 1 wherein the first type is n-type and the second type Ls p-type.

4. A laser diode as claimed in claim 1 wherein both the first type of AlGaInP cladding layer and the second type of AlGaInP cladding layer are of the form $(Al_xGa_{1-x})_{0.5}In_{0.5}P$, where x is larger than 0.7.

5. A laser diode as claimed in claim 1 wherein the active layer has the structure of a quantum well, which is formed by alternately growing $Ga_{0.5}In_{0.5}P$ and $(Al_yGa_{1-y})_{0.5}In_{0.5}P$, where x is between 0.4 and 0.6 and y is between 0.6 and 1.

6. A laser diode for digital versatile disks or other applications comprising:
    a first-type GaAs substrate;
    a first-type AlGaInP cladding layer formed on one side of the first-type GaAs substrate;
    an active layer with quantum wells formed on the first-type AlGaInP cladding layer;
    a first layer of second-type AlGaInP cladding layer formed on the active layer, having a ridge formed thereon;
    an $AlO_x$ layer formed in the first layer of second-type AlGaInP cladding layer, located at a lower portion of the ridge, in which an opening is formed on the $AlO_x$ layer to confine and block current flowed therethrough;
    a second layer of second-type AlGaInP cladding layer formed as ridges on the $AlO_x$ layer wherein one of the ridges is located in the opening of the $AlO_x$ layer;
    a second-type GaInP layer formed on the second layer of second-type AlGaInP cladding layer, which is located at an upper portion of the ridge;
    a second-type GaAs layer formed on the second-type GaInP layer;
    a second electrode formed on the second-type GaAs layer and the $AlO_x$ layer; and
    a first electrode formed on the other side of the first-type GaAs substrate.

7. A laser diode as claimed in claim 4 wherein the opening formed on the $AlO_x$ layer has a dimension of about 2~10 μm.

8. A laser diode as claimed in claim 4 wherein the first type is n-type and the second type is p-type.

9. A laser diode as claimed in claim 6 wherein both the first type of AlGaInP cladding layer and the second type of AlGaInP cladding layer are of the form $(Al_xGa_{1-x})_{0.5}In_{0.5}P$, where x is larger than 0.7.

10. A laser diode as claimed in claim 6 wherein the active layer has the structure of a quantum well, which is formed by alternately growing $Ga_xIn_{1-x}P$ and $(Al_yGa_{1-y})_{0.5}In_{0.5}P$, where x is between 0.4 and 0.6 and y is between 0.6 and 1.

* * * * *